United States Patent
Kühnelt et al.

(10) Patent No.: US 7,778,289 B2
(45) Date of Patent: Aug. 17, 2010

(54) OPTICALLY PUMPED SURFACE-EMITTING SEMICONDUCTOR LASER AND OPTICAL PROJECTION APPARATUS HAVING A SEMICONDUCTOR LASER SUCH AS THIS

(75) Inventors: Michael Kühnelt, Regensburg (DE); Ulrich Steegmüller, Regensburg (DE); Wolfgang Reill, Pentling (DE); Thomas Schwarz, Regensburg (DE); Frank Singer, Rengenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/529,976

(22) Filed: Sep. 28, 2006

(65) Prior Publication Data
US 2007/0081564 A1    Apr. 12, 2007

(30) Foreign Application Priority Data
Sep. 30, 2005   (DE) .................... 10 2005 047 147
Nov. 29, 2005   (DE) .................... 10 2005 056 949

(51) Int. Cl.
*H01S 3/098* (2006.01)
(52) U.S. Cl. .............. 372/19; 372/18; 372/25; 372/29.02; 372/43.01; 372/45.01; 372/50.124; 372/69; 372/70; 372/71; 372/72
(58) Field of Classification Search ............ 372/19, 372/18, 25, 29.02, 43.01, 45.01, 50.124, 372/69, 70, 71, 72
See application file for complete search history.

(56) References Cited

U.S. PATENT DOCUMENTS

| | | | | |
|---|---|---|---|---|
| 5,461,637 | A * | 10/1995 | Mooradian et al. | 372/92 |
| 6,185,241 | B1 * | 2/2001 | Sun | 372/96 |
| 6,327,293 | B1 * | 12/2001 | Salokatve et al. | 372/96 |
| 6,393,038 | B1 * | 5/2002 | Raymond et al. | 372/22 |
| 6,594,297 | B1 | 7/2003 | Hayakawa | |
| 6,611,543 | B2 * | 8/2003 | Hwang | 372/50.11 |
| 6,693,941 | B1 * | 2/2004 | Okazaki et al. | 372/75 |
| 6,735,234 | B1 * | 5/2004 | Paschotta et al. | 372/75 |
| 6,751,245 | B1 * | 6/2004 | Wasserbauer et al. | 372/46.01 |
| 6,798,804 | B2 * | 9/2004 | Hayakawa | 372/43.01 |

(Continued)

FOREIGN PATENT DOCUMENTS

DE     100 43 896 A1     4/2001

(Continued)

OTHER PUBLICATIONS

U. Steegmuller et al., "High Speed Green Frequency Converted Semiconductor Laser for Projection Displays", Digest of Technical Papers—SID International Symposium, vol. 36, No. 2, pp. 1608-1609, May 25, 2005.

(Continued)

*Primary Examiner*—Minsun Harvey
*Assistant Examiner*—Yuanda Zhang
(74) *Attorney, Agent, or Firm*—Cohen Pontani Lieberman & Pavane LLP

(57) ABSTRACT

An optically pumped, surface-emitting semiconductor laser having a mode-selective apparatus (7) which is intended for suppression of predeterminable, higher resonator modes of the semiconductor laser. The mode-selective apparatus is arranged in the beam path of a pump beam source (2) of the surface-emitting semiconductor laser.

19 Claims, 6 Drawing Sheets

U.S. PATENT DOCUMENTS

| | | | |
|---|---|---|---|
| 6,990,128 B2 * | 1/2006 | Koyama et al. | 372/18 |
| 7,356,062 B2 * | 4/2008 | Brick | 372/49.01 |
| 7,379,488 B2 * | 5/2008 | Kim | 372/99 |
| 2001/0012307 A1 | 8/2001 | Hayakawa | |
| 2002/0126720 A1 * | 9/2002 | Yang | 372/96 |
| 2004/0190567 A1 * | 9/2004 | Lutgen et al. | 372/25 |
| 2004/0213308 A1 * | 10/2004 | Abe et al. | 372/39 |
| 2004/0233961 A1 * | 11/2004 | Lutgen | 372/70 |
| 2004/0264532 A1 * | 12/2004 | Yoon et al. | 372/45 |
| 2005/0036528 A1 | 2/2005 | Schmid | |
| 2006/0029112 A1 * | 2/2006 | Young et al. | 372/7 |
| 2008/0095202 A1 * | 4/2008 | Yanagisawa et al. | 372/19 |

FOREIGN PATENT DOCUMENTS

| | | |
|---|---|---|
| EP | 1 693 936 A | 8/2006 |
| WO | WO 03/030316 A2 | 4/2003 |
| WO | WO 2005/055381 A1 | 6/2005 |
| WO | WO 2005/107027 A2 | 11/2005 |

OTHER PUBLICATIONS

H. Linberg et al., "Single-frequency operation of a high-power, long-wavelength semiconductor disk laser", Optics Letters Opt. Soc. of America, vol. 30, No. 17, pp. 2260-2262, Sep. 1, 2005.

Search Report dated Jan. 31, 2007 issued for the corresponding European Patent Application No. 06 020 601.8.

* cited by examiner

OPTICALLY PUMPED SURFACE-EMITTING SEMICONDUCTOR LASER AND OPTICAL PROJECTION APPARATUS HAVING A SEMICONDUCTOR LASER SUCH AS THIS

RELATED APPLICATIONS

This patent application claims the priority of German Patent Application no. 10 2005 047 147.1 filed Sep. 30, 2005 and 10 2005 056 949.8 filed Nov. 29, 2005, the disclosure content of which is hereby incorporated by reference.

FIELD OF THE INVENTION

An optically pumped surface-emitting semiconductor laser is specified. Furthermore, an optical projection apparatus having an optically pumped surface-emitting semiconductor laser such as this is specified.

BACKGROUND OF THE INVENTION

The document US 2005/0036528 describes an optically pumped surface-emitting semiconductor laser. In this semiconductor laser, a transparent heat sink makes thermal contact with a radiation-producing layer sequence.

SUMMARY OF THE INVENTION

One object of the present invention is to provide an optically pumped surface-emitting semiconductor laser whose laser emission is particularly stable over time.

This and other objects are attained in accordance with an aspect of the present invention directed to an optically pumped, surface-emitting semiconductor laser comprising a mode-selective apparatus to suppress predeterminable, higher resonator modes of the semiconductor laser wherein the mode-selective apparatus is firmly connected to a semiconductor body of the semiconductor laser.

An optically pumped surface-emitting semiconductor laser is specified. According to at least one embodiment of the semiconductor laser, the optically pumped surface-emitting semiconductor laser has a semiconductor body with a semiconductor layer sequence. The semiconductor layer sequence comprises, inter alia, a layer sequence which is suitable for radiation production and may include, for example, a pn-junction, a single quantum-well structure or a multiple quantum-well structure.

The semiconductor body preferably furthermore has a reflective layer or layer sequence which is suitable for reflection of at least a portion of the electromagnetic radiation produced in the layer sequence provided for radiation production. The reflective layer sequence for this purpose comprises, for example, a Bragg mirror.

Electromagnetic radiation which is produced in the radiation-producing layer sequence during operation of the semiconductor laser preferably emerges from the semiconductor body through a surface through which radiation can pass. The surface through which radiation can pass is in this case formed by one main surface of the semiconductor body, which is arranged on a side of the radiation-producing layer sequence facing away from the reflective layer sequence.

The optically pumped surface-emitting semiconductor laser preferably has a further mirror which is arranged for example externally, that is to say away from the semiconductor body. The external mirror and the reflective layer sequence in the semiconductor body form a resonator, in which electromagnetic radiation which is produced and/or amplified in the radiation-producing layer sequence can circulate.

According to at least one embodiment, the optically pumped surface-emitting semiconductor laser also has a pump beam source. The pump beam source is preferably arranged outside the semiconductor body. The pump beam source may, for example, be arranged in such a manner that it passes pump radiation through the surface of the semiconductor body through which radiation can pass into the radiation-producing layer sequence of the semiconductor body. The pump radiation produces charge-carrier pairs, for example, in the radiation-producing layer sequence of the semiconductor body. Electromagnetic radiation is then produced by recombination of the charge-carrier pairs. The electromagnetic radiation which is produced in this way can leave the semiconductor body through the surface through which radiation can pass.

The pump beam source is, for example, one or more edge-emitting semiconductor lasers, for example one or more diode lasers.

According to at least one embodiment of the optically pumped surface-emitting semiconductor layer, the semiconductor laser also has a mode-selective apparatus. The mode-selective apparatus is preferably suitable for the suppression of higher, predeterminable resonator modes. This means that the mode-selective apparatus is intended to suppress resonator modes above a specific, predeterminable mode number. This means that excitation of these higher resonator modes in the resonator formed by the reflective layer sequence and the external mirror is prevented by the mode-selective apparatus. For example, the mode-selective apparatus is suitable for prevention of the excitation of all modes except for the transverse fundamental mode of the resonator. Only the transverse fundamental mode can then be excited in the resonator. The mode-selective apparatus is in this case preferably arranged in the resonator of the optically pumped surface-emitting semiconductor laser, that is to say between the external mirror and the reflective layer sequence.

According to at least one embodiment of the optically pumped surface-emitting semiconductor laser, the mode-selective apparatus is firmly connected to the semiconductor body of the semiconductor laser. In this case, by way of example, the mode-selective apparatus may be mechanically connected on that surface of the semiconductor body through which radiation can pass. It is also possible for the mode-selective apparatus to be formed from a part of the semiconductor body. The mode-selective apparatus may then form a part of the surface of the semiconductor body through which radiation can pass.

According to at least one embodiment of the optically pumped surface-emitting semiconductor laser, the mode-selective apparatus is arranged in the beam path of the pump beam source. This means that the pump radiation passes through the mode-selective apparatus on its way to the radiation-producing layer sequence of the semiconductor body. In this case, it is possible for the pump radiation to be optically influenced by the mode-selective apparatus. However, it is also possible for the pump radiation to pass through the mode-selective apparatus without being significantly disturbed by it. Without being significantly disturbed means that there is no interaction, or scarcely any interaction, between the mode-selective apparatus and the pump radiation. The intensity of the pump beam—and thus the pump power—is then not reduced, or is reduced only slightly by the mode-selective apparatus.

The arrangement of the mode-selective apparatus in the beam path of the pump beam source makes it possible to arrange the mode-selective apparatus as close as possible to the surface of the semiconductor body through which radiation can pass.

According to at least one embodiment of the optically pumped surface-emitting semiconductor laser, a semiconductor laser is specified having a mode-selective apparatus which is intended to suppress predeterminable, higher resonator modes of the semiconductor laser. In this case, the mode-selective apparatus is arranged in the beam path of the pump beam source.

According to at least one embodiment of the optically pumped surface-emitting semiconductor laser, the mode-selective apparatus is suitable for optically influencing at least a portion of the pump radiation. For example, the mode-selective apparatus may be suitable for variation of the direction or of the intensity of a portion of the pump radiation. The apparatus may, for example, be suitable for absorption, for reflection and/or for optical refraction of a portion of the pump radiation.

The optically pumped surface-emitting semiconductor laser described here makes use, inter alia, of the idea that the mode-selective apparatus can carry out a multiple function if it is arranged in the beam path of the pump beam source. For example, the mode-selective apparatus may on the one hand be suitable for selection of undesirable higher resonator modes of the laser. Furthermore, the mode-selective apparatus may be suitable for variation of the profile of the pump radiation in a predeterminable manner. Partial absorption of the pump radiation by means of the mode-selective apparatus makes it possible, for example, for only specific areas of the radiation-producing layer sequence of the semiconductor body to be optically pumped. This makes it possible to select a desired pump profile in the radiation-producing layer sequence. The mode-selective apparatus can thus be used to specifically select the excitation profile and thus the beam profile of the laser radiation to be produced. Furthermore, the absorption or reflection of a portion of the pump radiation by the mode-selective apparatus reduces the heating of the semiconductor body by the pump radiation. This has been found to be particularly advantageous for the thermal behavior of the semiconductor laser.

According to at least one embodiment, the mode-selective apparatus has a suppression area which is suitable for influencing the electromagnetic radiation which strikes it and circulates in the resonator in such a manner that it is lost to the resonator power. The suppression area of the mode-selective apparatus is, for example, suitable for absorption, for reflection and/or for optical refraction of electromagnetic radiation which strikes it. The suppression area may in this case also be suitable for changing the direction of a portion of the laser radiation circulating in the resonator, so that this portion of the radiation is refracted out of the resonator and can no longer contribute to laser production. The suppression area may, however, also be suitable for attenuation or for complete absorption of a portion of the laser radiation passing through it.

According to at least one embodiment of the optically pumped surface-emitting semiconductor laser, the mode-selective apparatus has, in addition to the suppression area, an area through which radiation circulating in the resonator can pass essentially without any disturbance. This proportion of the laser radiation circulating in the resonator is scarcely optically influenced, or is not optically influenced at all, by the mode-selective apparatus. This proportion of the laser radiation circulating in the resonator can enter that area of the semiconductor body which is intended for radiation production, where it can be amplified by induced emission.

According to at least one embodiment of the optically pumped surface-emitting semiconductor laser, the size of the area through which the radiation circulating in the laser resonator can pass without any significant disturbance is chosen in such a manner that only the transverse fundamental mode of the resonator can be excited. This means that only laser radiation in the transverse fundamental mode is then not disturbed by the mode-selective apparatus, that is to say in particular by the suppression area, so that only this mode is excited in the resonator.

The optically pumped surface-emitting semiconductor laser described here in this case makes use, inter alia, of the discovery that the transverse fundamental mode has a smaller beam diameter than higher transverse modes. The choice of the diameter of a zone which, for example, is chosen to be circular, can then be used to select those modes which are intended to be excited in the resonator. The larger this diameter is chosen to be, the higher the transverse modes which can be excited in the resonator. The diameter of the zone is then preferably chosen such that only the transverse fundamental mode is excited.

According to at least one embodiment of the optically pumped surface-emitting semiconductor laser, the mode-selective apparatus is in direct contact with the surface of the semiconductor body through which radiation can pass. This means, for example, that the mode-selective apparatus is applied to the surface of the semiconductor body through which radiation can pass. For example, the mode-selective apparatus may for this purpose comprise a metal coating, which is applied to the surface of the semiconductor body through which radiation can pass. The mode-selective apparatus may, for example, then be formed by an annular coating which contains a metal. The annular coating has an opening which forms the area of the mode-selective apparatus, through which laser radiation can pass without significant disturbance. The suppression area of the mode-selective apparatus is then formed by the metal of the annular coating, which absorbs and/or reflects incident radiation.

According to at least one embodiment, the metal coating in this case has a maximum thickness of 15 nm. Electromagnetic radiation is then not absorbed completely by the metal layer, but is only attenuated. This means, for example, that pump radiation which strikes the metal coating can then enter the semiconductor body, having been attenuated by the surface through which radiation can pass. Radiation which is circulating in the resonator is, however, incident on the metal coating as it circulates, and is in this case attenuated to an ever greater extent, thus suppressing the excitation of higher transverse modes.

According to at least one embodiment, the metal coating has a thickness of at least 25 nm. A metal coating with a thickness such as this as a suppression area of the mode-selective apparatus largely completely absorbs and/or reflects electromagnetic radiation which strikes it. This means that even pump radiation which strikes a suppression area such as this cannot enter the semiconductor body. This component of the pump radiation then does not contribute to the heating of the semiconductor body either, thus making it possible to improve the thermal behavior of the semiconductor laser.

The optically pumped surface-emitting semiconductor laser described here in this case makes use, inter alia, of the discovery that edge areas of a pump beam often strike zones of the radiation-producing layer sequence of the semiconductor body where they can contribute only slightly to the pump power, but can have a very major effect on the heating of the semiconductor body. These edge areas of the pump beam can be absorbed or reflected by a metal coating that is chosen to be sufficiently thick, even before they enter the semiconductor body.

According to at least one embodiment of the optically pumped surface-emitting semiconductor laser, the mode-selective apparatus is formed by a zone which is structured into the semiconductor body. This means that the mode-selective apparatus is not an apparatus that is applied separately to the semiconductor body, but is an integral component of the semiconductor body. For example, the mode-selective apparatus is produced by structuring of the surface of the semiconductor body through which radiation can pass, for example by means of an etching process. By way of example, this makes it possible to structure oblique flanks into the surface of the semiconductor body through which radiation can pass, which refract electromagnetic radiation which is incident on them and is circulating in the resonator out of the resonator, in this way forming suppression areas of the mode-selective apparatus. Furthermore, the suppression areas of the mode-selective apparatus can be formed by roughening of a portion of the surface of the semiconductor body through which radiation can pass. This likewise results in radiation that strikes the suppression area being optically refracted or diffusely scattered.

According to at least one embodiment, the suppression area of the mode-selective apparatus is structured, for example etched, into the semiconductor body. For example, the semiconductor body is in this case etched in such a manner that parts of the radiation-reflective and/or radiation-producing layer sequence of the semiconductor body are removed, so that no electromagnetic radiation can be reflected and/or produced in these areas. This also makes it possible to suppress excitation of predeterminable resonator modes.

According to at least one embodiment of the optically pumped surface-emitting semiconductor laser, the mode-selective apparatus is formed by an element which is applied to the surface of the semiconductor body through which radiation can pass. The element is then preferably thermally connected to the semiconductor body. The element allows at least part of the pump radiation to pass through it, so that pump radiation from the pump beam source can enter the semiconductor body through the element. The element may in this case, by way of example, be an optical element which has frequency-selective characteristics. For example, the element is an etalon or a birefringent filter.

The mode-selective apparatus is preferably applied to the element or is integrated in the element. The mode-selective apparatus may in this case be formed by a coating, structuring or roughening of parts of the element, as described above.

According to at least one embodiment of the optically pumped surface-emitting semiconductor laser, the element is particularly highly thermally conductive and thus acts as a heat spreader or heat sink for the heat produced in the semiconductor body during operation of the laser. At the same time, the element may be used as a frequency-selective element.

According to at least one embodiment of the optically pumped surface-emitting semiconductor laser, the element is an etalon, which is composed of diamond or silicon carbide, or contains one of these materials. The element makes thermal contact with the surface of the semiconductor body through which radiation can pass. Because of its high thermal conductivity, an element such as this acts as a heat sink and at the same time has frequency-selective characteristics which, for example, allow particularly stable fundamental-mode operation of the laser.

According to at least one embodiment, an optically non-linear crystal is arranged in the resonator of the semiconductor laser. The optically non-linear crystal is preferably provided for frequency conversion of at least a portion of the laser radiation circulating in the resonator.

According to at least one embodiment of the laser apparatus, the optically non-linear crystal comprises at least one of the following crystals: lithium triborate, for example $LiB_3O_5$ (LBO), bismuth triborate, for example $BiB_3O_6$ (BiBO), potassium titanyl phosphate $KTiOPO_4$ (KTP), magnesium-oxide-doped conjugate lithium niobate, for example $MgO:LiNbO_3$ (MgO:LN), magnesium-oxide-doped stoichiometric lithium niobate, for example $MgO:s-LiNbO_3$ (MgO:SLN), magnesium-oxide-doped stoichiometric lithium tantalate, for example ($MgO:LiTaO_3$ (MgO:SLT), stoichiometric ($LiNbO_3$ (SLN), stoichiometric $LiTaO_3$ (SLT), RTP ($RbTiOPO_4$), KTA ($KTiOAsO_4$), RTA ($RbTiOAsO_4$), CTA ($CsTiOAsO_4$).

The optically non-linear crystal is preferably suitable for doubling the frequency of the radiation passing through it.

Furthermore, an optical projection apparatus is specified which has at least one optically pumped surface-emitting semiconductor laser, as is described in conjunction with the embodiments mentioned above. Furthermore, the projection apparatus may, for example, have drive electronics for driving the laser, and may have a housing in which drive electronics and the optically pumped surface-emitting semiconductor laser are integrated. An optical projection apparatus such as this is particularly highly suitable for use in a multimedia projector or in a back-projection television. Because of its compact size, an optical projection apparatus such as this can also be used in small appliances, such as mobile radio telephones.

DETAILED DESCRIPTION OF THE DRAWINGS

Identical components or parts having the same effect in the exemplary embodiments and figures are in each case provided with the same reference symbols. The illustrated elements should not be regarded as being to scale, and in fact individual elements may be illustrated in an exaggerated form, in order to assist understanding.

Figure 1:
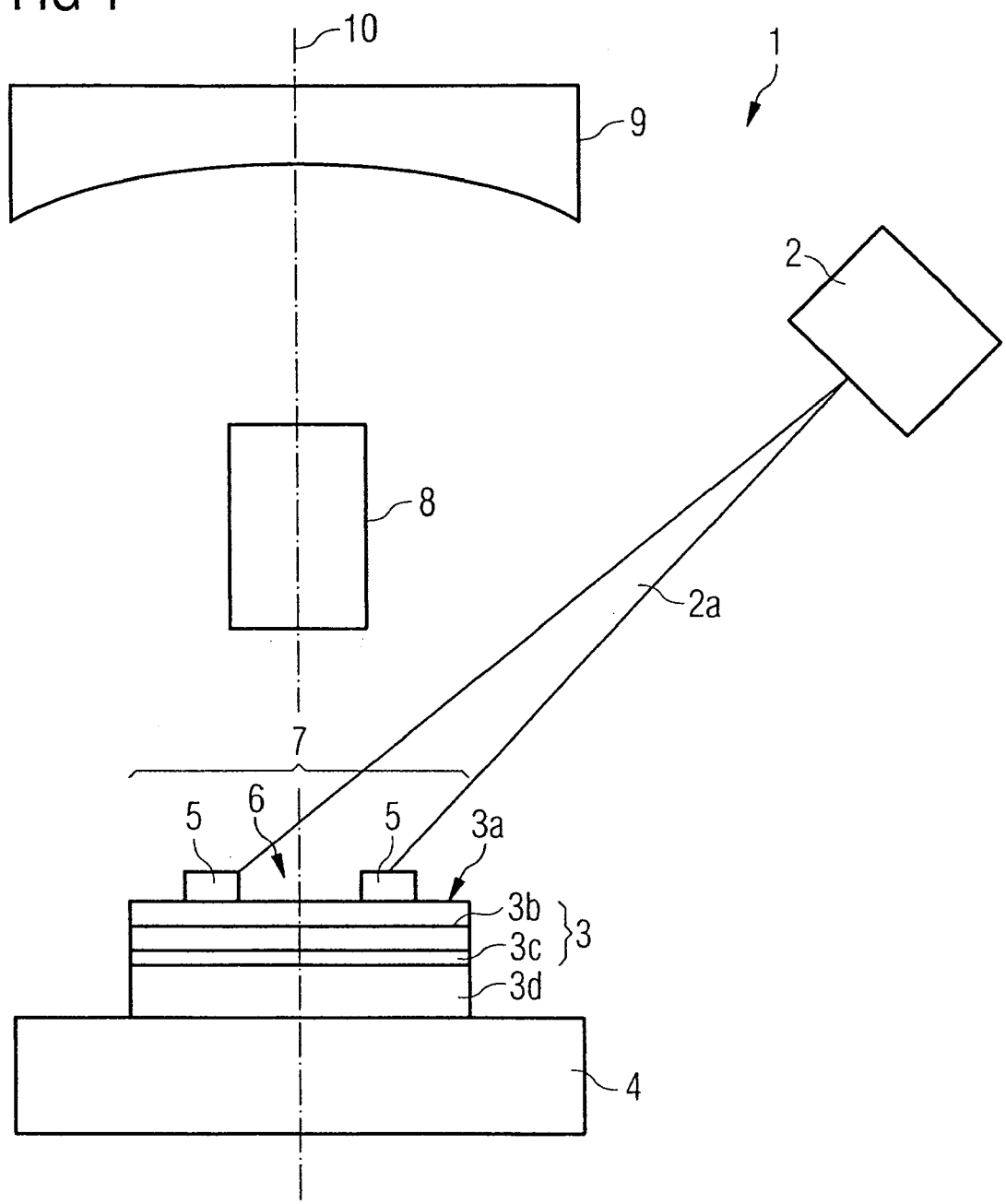
FIG. 1 shows a schematic section illustration of the optically pumped surface-emitting semiconductor laser, according to a first exemplary embodiment.

FIG. 1 shows a schematic section illustration of the optically pumped surface-emitting semiconductor laser, as described here, according to a first exemplary embodiment.

The semiconductor laser has a semiconductor body 3. The semiconductor body 3 is connected to a mount 3d. The semiconductor body 3 has a reflective layer sequence 3c. In addition, the semiconductor body 3 has a radiation-producing layer sequence 3b. Electromagnetic radiation can leave the semiconductor body through the surface 3a through which radiation can pass, or can enter the semiconductor body 3 through the surface 3a through which radiation can pass.

The mount 3d may be a growth substrate. The reflective layer sequence 3c and the radiation-emitting layer sequence 3b are then preferably epitaxially grown on the mount 3d. In this case, the mount 3d may also be a thinned growth substrate, whose thickness is reduced to at most 100 µm. If the mount 3d is a growth substrate or a thinned growth substrate, then the mount 3d preferably contains or is composed of gallium arsenide.

Furthermore, it is possible for the mount 3d to be a mount 3d which is applied to that surface of the semiconductor body 3 which faces away from the original growth substrate, after completion of the growth of the layers of the semiconductor body 3. The growth substrate is then removed from the epitaxially grown layer sequences 3c and 3b. In this case, by way of example, the mount 3d may be an electrochemically deposited layer or layer sequence.

The radiation-reflective layer sequence 3c is a reflective metal layer, a Bragg mirror or a combination of these reflective layers. In the exemplary embodiment shown in FIG. 1, the reflective layer sequence 3b is a Bragg mirror. The Bragg mirror has a plurality of semiconductor layer pairs with an advantageously high refractive-index difference. For example, one gallium—arsenide λ/4 layer and one aluminium—gallium—arsenide λ/4 layer in each case form a semiconductor layer pair. The plurality of layer pairs in the Bragg mirror is indicated schematically in FIG. 1 by the layer 3c. The Bragg mirror preferably has a sequence of 20-30 or more semiconductor layer pairs, which results in the Bragg mirror having a particularly high reflectivity of 99.9% or more. The Bragg mirror is advantageously produced epitaxially together with the other semiconductor layer sequences of the semiconductor body 3.

The radiation-producing layer sequence 3b preferably has an active area with a pn-junction, a single quantum-well structure or preferably a multiple quantum-well structure, which is suitable for radiation production. The expression quantum-well structure for the purposes of the application covers, in particular, any structure in which charge carriers have their energy states quantized by confinement. In particular, the expression quantum-well structure does not include any details about the dimensions of the quantization. It thus covers, inter alia, quantum troughs, quantum wires and quantum points, and any combination of these structures.

The radiation-emitting layer sequence 3b is preferably based on a III-V compound semiconductor material. This means that the radiation-emitting layer sequence 3b comprises at least one layer which is composed of a III-V compound semiconductor material. The radiation-emitting layer sequence 3b is preferably based on a nitride, phosphide or, particularly preferably, arsenide, compound semiconductor.

In the present context, "based on nitride compound semiconductors" means that the radiation-emitting layer sequence 3b or at least one layer of it is composed of a nitride-V compound semiconductor material, preferably $Al_nGa_mIn_{1-n-m}N$, where $0 \leq n \leq 1$, $0 \leq m \leq 1$ and $n+m \leq 1$. In this case, this material need not necessarily have exactly the same mathematical composition as the above formula. In fact, it may have one or more dopants as well as additional components which do not significantly change the characteristic physical properties of the $Al_nGa_mIn_{1-n-m}N$ material. For the sake of simplicity, the above formula includes, however, only the major components of the crystal lattice (Al, Ga, In, N), even if some of these can be replaced by small amounts of further substances.

In this context, "based on phosphide compound semiconductors" means that the radiation-emitting layer sequence 3b or at least one layer of it is preferably composed of $Al_nGa_mIn_{1-n-m}N$ where $0 \leq n \leq 1$, $0 \leq m \leq 1$ and $n+m \leq 1$. In this case, this material need not necessarily have exactly the same mathematical composition as the above formula. In fact, it may have one or more dopants as well as additional components which do not significantly change the characteristic physical properties of the material. For the sake of simplicity, the above formula includes, however, only the major components of the crystal lattice (Al, Ga, In, N), even if some of these can be replaced by small amounts of further substances.

In this context, "based on arsenide compound semiconductors" means that the radiation-emitting layer sequence 3b or at least one layer of it is preferably composed of $Al_nGa_mIn_{1-n-m}As$ where $0 \leq n \leq 1$, $0 \leq m \leq 1$ and $n+m \leq 1$. In this case, this material need not necessarily have exactly the same mathematical composition as the above formula. In fact, it may have one or more dopants as well as additional components which do not significantly change the characteristic physical properties of the material. For the sake of simplicity, the above formula includes, however, only the major components of the crystal lattice (Al, Ga, In, N), even if some of these can be replaced by small amounts of further substances.

These materials are distinguished by high internal quantum efficiencies which can be achieved in a simplified manner, and are suitable for radiation from the ultraviolet spectral band (in particular nitride-based compound semiconductor material), via the visible spectral band (in particular phosphide-based compound semiconductor materials) into the infrared spectral band (in particular arsenide-based compound semiconductor materials).

The radiation-producing layer sequence 3b in the semiconductor body 3 is preferably based on an arsenide compound semiconductor material. Radiation in the infrared spectral band, in particular in the wavelength band between 800 nm and 1100 nm, can be produced particularly efficiently using this material system. By way of example, the mount 3d contains gallium arsenide, and the radiation-emitting layer sequence 3b, or at least one layer of it, is based on the material system $Al_nGa_mIn_{1-n-m}As$ where $0 \leq n \leq 1$, $0 \leq m \leq 1$ and $n+m \leq 1$.

The semiconductor body 3 is applied, preferably soldered, with its mount 3d to a mount 4. The mount 4 is preferably composed of a highly thermally conductive material such as a copper or a copper compound material.

The optically pumped surface-emitting semiconductor laser also has a pump beam source 2 which is suitable for production of pump radiation 2a—preferably laser radiation. The pump beam source 2 is provided, for example, by one or more diode lasers. In addition, the pump beam source may also be followed by an optical arrangement comprising, for example, at least one lens in the emission direction, which focuses the pump radiation 2a onto the semiconductor body 3.

Furthermore, the semiconductor laser has an external mirror 9. The external mirror 9 has a concave-curved surface, by way of example.

This allows the optically pumped semiconductor body 3 to produce laser radiation which circulates in the resonator, which is formed by the reflective layer sequence 3c and the at least one external mirror 9.

Furthermore, an optically non-linear crystal 8 which, for example, is suitable for frequency doubling, can be arranged in the laser resonator.

In this case, the external mirror 9 has particularly high reflectivity for the electromagnetic radiation produced in the radiation-emitting layer sequence 3b, and is highly transmissive for the portion of the radiation whose frequency has been converted.

The radius of curvature of the external mirror 9 is now chosen by way of example to be 9 to −15 mm and the resonator length is chosen to be 10 mm, this results in the beam diameter for the laser radiation circulating in the resonator at the surface 3a of the semiconductor body 3 through which radiation can pass being dependent on the transverse mode number for a semiconductor laser as illustrated schematically in FIG. 1. The transverse fundamental mode $TEM_{00}$ in this calculation example has a beam diameter of about 100 μm, measured at the surface 3a through which radiation can pass. The transverse mode $TEM_{11}$ has a beam diameter of about 170 μm, measured at the surface 3a through which radiation can pass. The transverse mode $TEM_{22}$ has a beam diameter of about 210 μm measured at the surface 3a through which radiation can pass.

The optically pumped surface-emitting semiconductor laser described here now makes use of the idea that a mode-selective apparatus 7 can be used to prevent the excitation of modes which have a larger diameter than a predeterminable transverse mode. This makes it possible to produce a semiconductor laser which, for example, allows stable fundamental-mode operation with efficient use of the pump radiation 2a. Since the fundamental mode has a smaller beam diameter than the higher transverse modes, the conversion efficiency in the frequency-doubling process in the optically non-linear crystal 8 is also improved.

Mode noise is effectively suppressed as a cause for power instability.

Figure 2A:
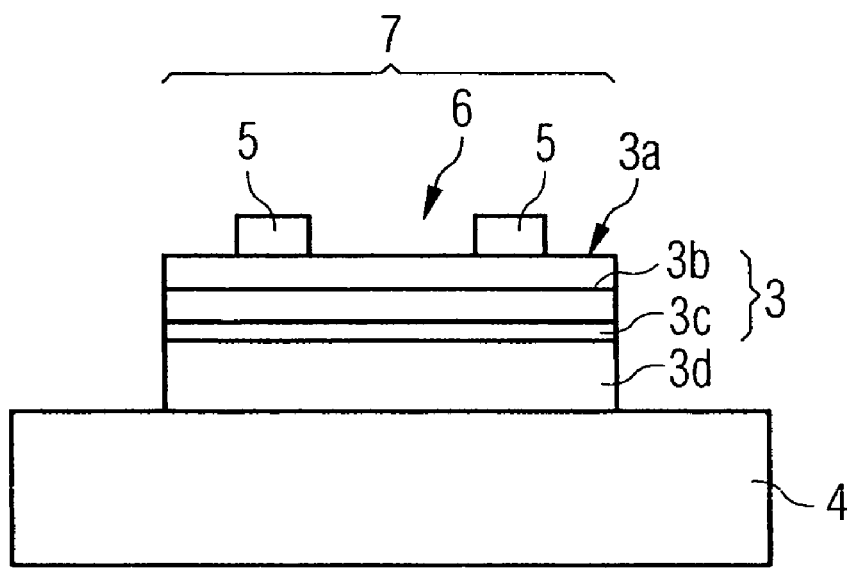
FIG. 2A shows a schematic section illustration of a semiconductor body according to second and third exemplary embodiments of the optically pumped surface-emitting semiconductor laser.
Figure 2B:
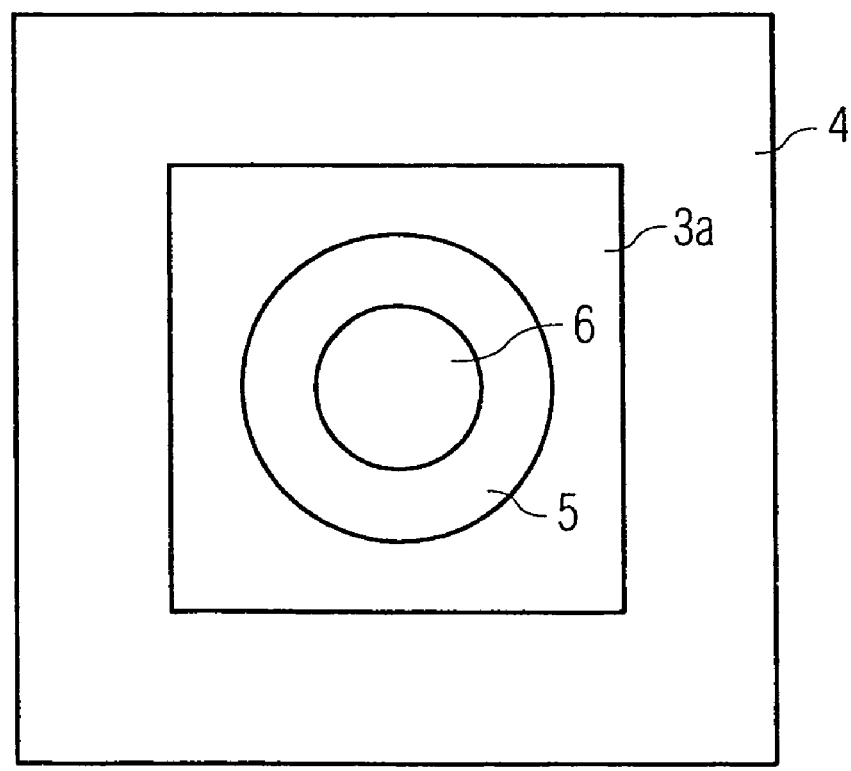
FIG. 2B shows a schematic plan view of the semiconductor body according to the second and third exemplary embodiments of the optically pumped surface-emitting semiconductor laser.

FIG. 2A shows a schematic section illustration of the disc laser with a semiconductor body 3, mount 4 and mode-selective apparatus 7 according to a second exemplary embodiment of the optically pumped surface-emitting semiconductor laser. FIG. 2B shows, schematically, the associated plan view of the semiconductor body 3.

The mode-selective apparatus 7 has a suppression area 5 and an opening 6. Electromagnetic radiation which is produced in the semiconductor body 3 can leave the semiconductor body 3 through the opening 6, through the surface 3a through which radiation can pass. Furthermore, the pump radiation 2a can enter the semiconductor body 3 through the opening 6. In the exemplary embodiment shown in FIG. 2A, the suppression area 5 may be in the form of a thin, semitransparent metal layer.

The suppression area 5 preferably contains or is composed of at least one of the following metals which, for example, form a ring on the surface through which radiation can pass: chromium, platinum, gold. The layer thickness of the metal ring is preferably between 5 nm and 15 nm. A metal layer such as this is partially permeable for the pump radiation 2a that occurs. A thin metal layer such as this outside the opening 6 acts as an effective loss mechanism for the laser light which circulates repeatedly in the resonator, and, with an appropriately chosen opening diameter, suppresses higher resonator modes, for example higher modes than the fundamental mode.

The passage of part of the pump radiation 2a through the suppression area 5 has the advantage that edges of the radiation-producing layer sequence 3b are also optically pumped. Accordingly, the excitation profile at the edge of the radiation-producing layer sequence 3b is less adversely affected by charge-carrier diffusion in the semiconductor. The permeability also results in the thermal load in the suppression area 5 being low. In fact, in this exemplary embodiment, more pump power is absorbed in the semiconductor body 3 than would be the case, for example, with a metal layer that was completely impermeable to radiation. This can have a negative influence on the thermal characteristics of the semiconductor body 3.

In a further exemplary embodiment, the suppression area 5 is provided by a non-transparent metal layer. The suppression area 5 preferably contains or is composed of one of the following metals, which are arranged as a ring with an opening 6 on the surface 3a of the semiconductor body through which radiation can pass: chromium, platinum, gold. The layer thickness of the metal layer in this exemplary embodiment is preferably at least 25 nm. Pump radiation 2a which strikes the suppression area 5 outside the opening 6—that is to say it strikes the non-transparent metal layer—is reflected or absorbed and does not enter the semiconductor body 3. Due to the great thickness of the metal layer of at least 25 nm, the thermal load resulting from the absorption of pump radiation and circulating radiation does not lead to detachment of the metal layer.

In this exemplary embodiment, the excitation profile in the radiation-producing layer sequence 3b can advantageously be chosen as a section from the incident pump profile. The profile of the pump radiation 2a may be somewhat flatter (flat top) than in the case of the exemplary embodiment described above, by choosing the pump beam diameter to be sufficiently large that the falling flanks of the intensity of the pump radiation 2a come to rest outside the opening 6 on the suppression area 5. Pump radiation 2a which does not enter the semiconductor body 3 does not contribute to laser emission. The semiconductor laser is admittedly in consequence less efficient, but this avoids the heating of the semiconductor body 3 caused by the pump radiation 2a being absorbed in the suppression area 5. This has been found to be advantageous for the thermal behavior of the laser system. Overall, in this exemplary embodiment, the mode-selective apparatus 7 not only masks out higher transverse modes, but also makes it possible for the pump profile to be modulated in the semiconductor body 3 in such a manner that pumping can be carried out specifically into the fundamental mode.

Figure 3A:
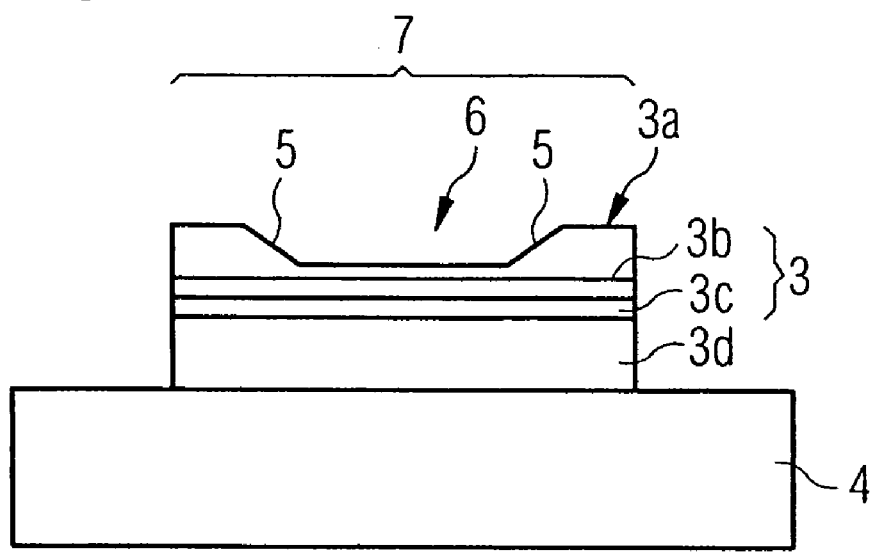
FIG. 3A shows a schematic section illustration of a semiconductor body according to a fourth exemplary embodiment of the optically pumped surface-emitting semiconductor laser.
Figure 3B:
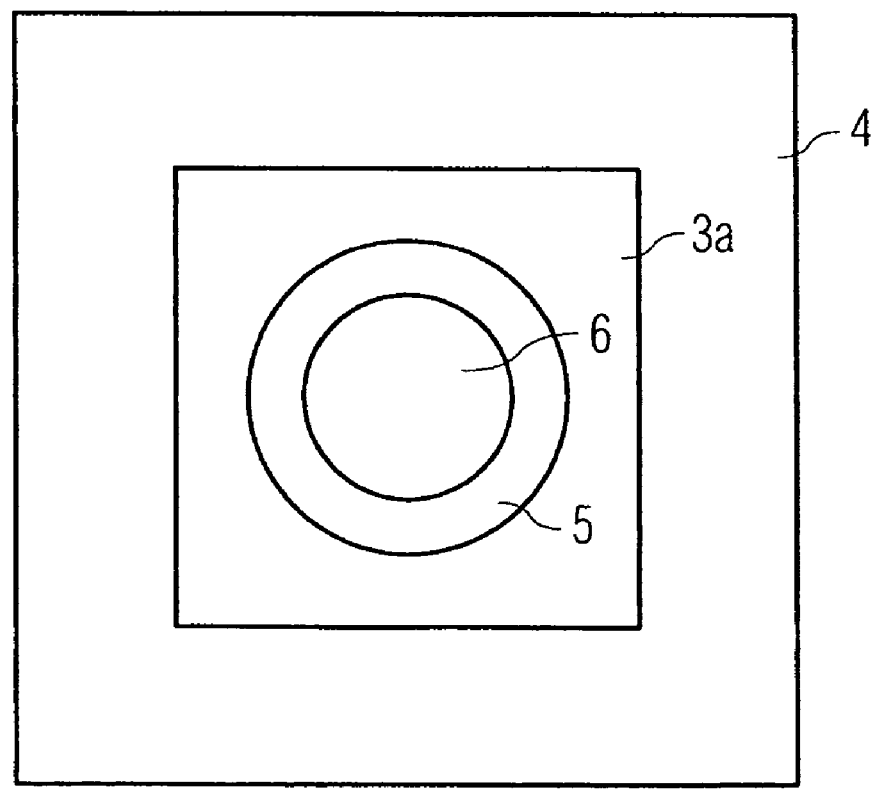
FIG. 3B shows a schematic plan view of the semiconductor body according to the fourth exemplary embodiment of the optically pumped surface-emitting semiconductor laser.

FIG. 3A shows a semiconductor body with a mode-selective apparatus 7 on a mount 4, illustrated schematically, for a further exemplary embodiment of the optically pumped surface-emitting semiconductor laser described here. FIG. 3B shows an associated schematic plan view.

In this exemplary embodiment, the mode-selective apparatus is structured as a topographic structure into the semiconductor body 3. For this purpose, for example, the area of the opening 6 is etched free, while the suppression area 5 is in the form of a flank with a predeterminable pitch angle. Laser radiation circulating in the resonator is not intrinsically itself reflected back outside the opening 6 but, for example, is refracted out of the resonator by the flanks of the suppression area 5. This radiation is therefore lost to the resonator power. The only resonator modes which can be formed are those which are sufficiently high that their diameters are within the opening 6.

The suppression area 5 can in this case also be produced by roughening of the surface 3a through which the radiation can pass. Depending on the surface characteristics and/or the pitch angles of the flanks of the suppression area 5, the pump radiation 2a may or may not enter the semiconductor body 3 at the edges of the opening 6.

Figure 4A:
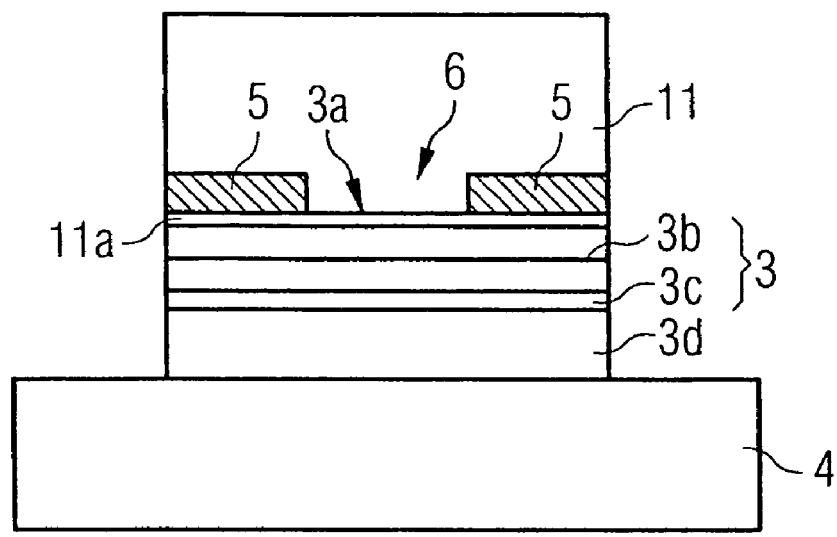
FIG. 4A shows a schematic section illustration of a semiconductor body according to a fifth exemplary embodiment of the optically pumped surface-emitting semiconductor laser.
Figure 4B:
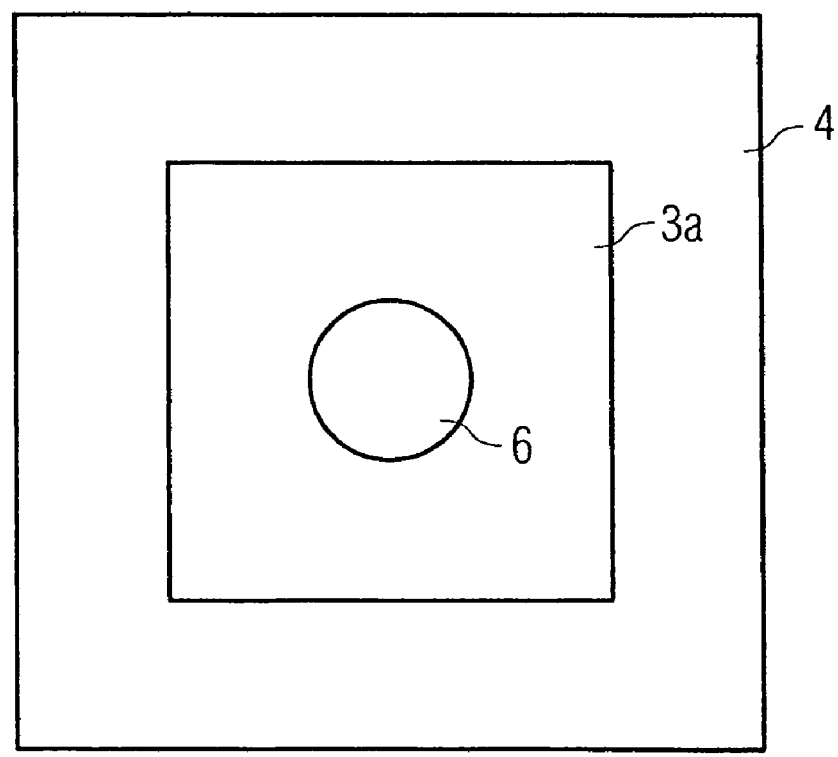
FIG. 4B shows a schematic view of the semiconductor body according to the fifth exemplary embodiment of the optically pumped surface-emitting semiconductor laser.

FIG. 4A shows a schematic section illustration of a semiconductor body 3 with a mount 4 for a further exemplary embodiment of the optically pumped surface-emitting semiconductor laser described here. FIG. 4B shows the associated plan view.

In this exemplary embodiment, the suppression area 5 is applied to an optical element 11. By way of example, the suppression area 5 is formed by a metal layer, etching, roughening, or a recess in the optical element 11. In this case, coatings or surface structurings can be used, such as those described in the exemplary embodiments mentioned above, for the coating or structuring of the semiconductor body 3.

The optical element 11 is preferably a frequency-selective element, which is suitable for reducing the spectral width of the electromagnetic radiation passing through the optical element. For example, the optical element is an etalon or a birefringent filter. The optical element 11 thus allows, for example in conjunction with the mode-selective apparatus 7, particularly stable fundamental-mode operation, and thus particularly efficient frequency conversion by the optically non-linear crystal 8 (see FIG. 1).

The optical element is preferably composed of or contains one of the following materials: diamond, silicon carbide. The optical element 11 is also used, in addition to its optical characteristics, as a heat sink or heat spreader in the resonator of the optically pumped surface-emitting semiconductor laser. This means that the optical element 11 absorbs heat that is produced in the semiconductor body 3 during operation of the laser, and emits this heat to the surrounding area. This advantageously improves the thermal characteristics of the optically pumped surface-emitting semiconductor laser.

By way of example, the optical element 11 may be fixed to the surface 3a of the semiconductor body 3 through which radiation can pass, by means of an electroplated layer 11a. This results in a particularly good thermal link between the optical element 11 and the semiconductor body 3.

Figure 5A:
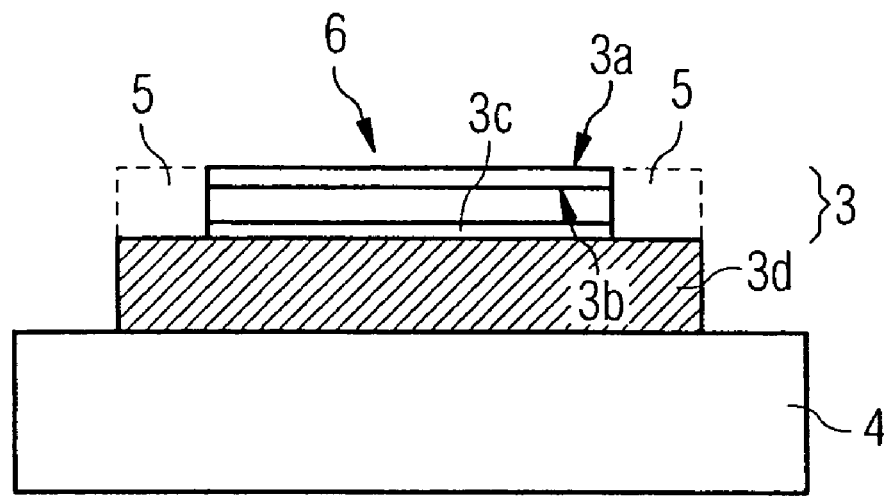
FIG. 5A shows a schematic section illustration of a semiconductor body according to a sixth exemplary embodiment of the optically pumped surface-emitting semiconductor laser.
Figure 5B:
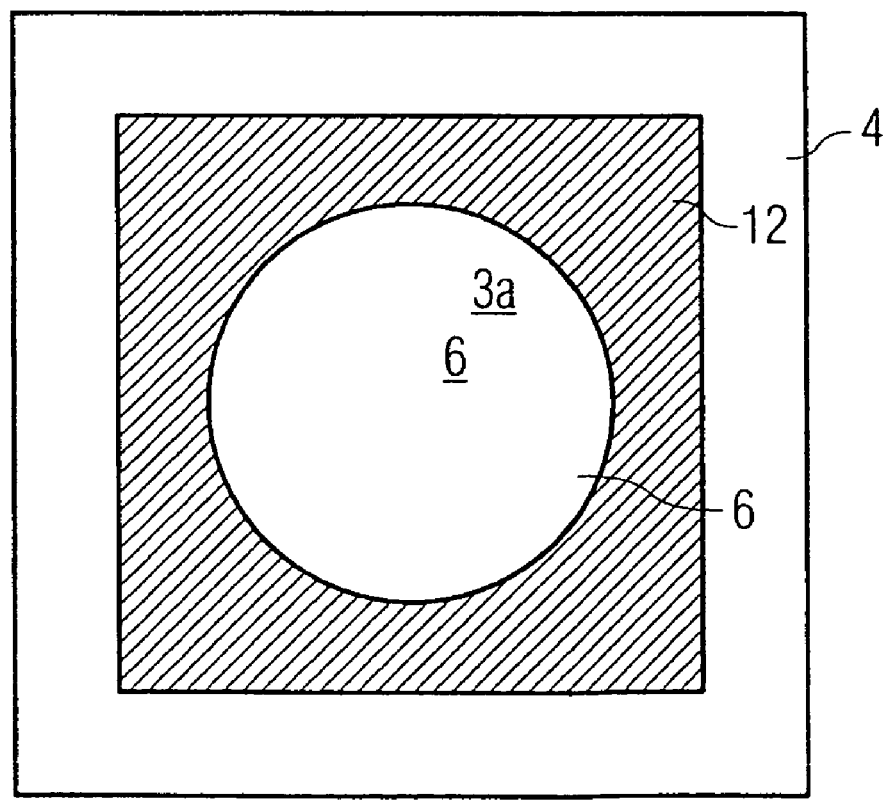
FIG. 5B shows a schematic plan view of the semiconductor body according to the sixth exemplary embodiment of the optically pumped surface-emitting semiconductor laser.

FIG. 5A shows a schematic section illustration of a semiconductor body 3 with a mount 4 for a further exemplary embodiment of the optically pumped surface-emitting semiconductor laser described here. FIG. 5B shows, schematically, the associated plan view.

In this exemplary embodiment, the suppression area 5 is produced by removal of parts of the semiconductor body 3. For this purpose, by way of example, at least the radiation-reflective layer sequence 3c and/or the radiation-producing layer sequence 3b are/is removed as far as the opening 6, for example by etching them away. Laser radiation circulating in the resonator is then not intrinsically itself reflected back outside the opening 6, and is thus lost to the resonator power. The only resonator modes which can be formed are those whose diameter is limited by the opening 6.

Furthermore, in this exemplary embodiment, the growth substrate is removed from the epitaxially grown layers 3b, 3c. In order to make the remaining layers 3b, 3c mechanically robust, these are reinforced by means of a supporting layer 3d—for example an electroplated gold layer—on the side facing away from the original growth substrate.

Figure 6:
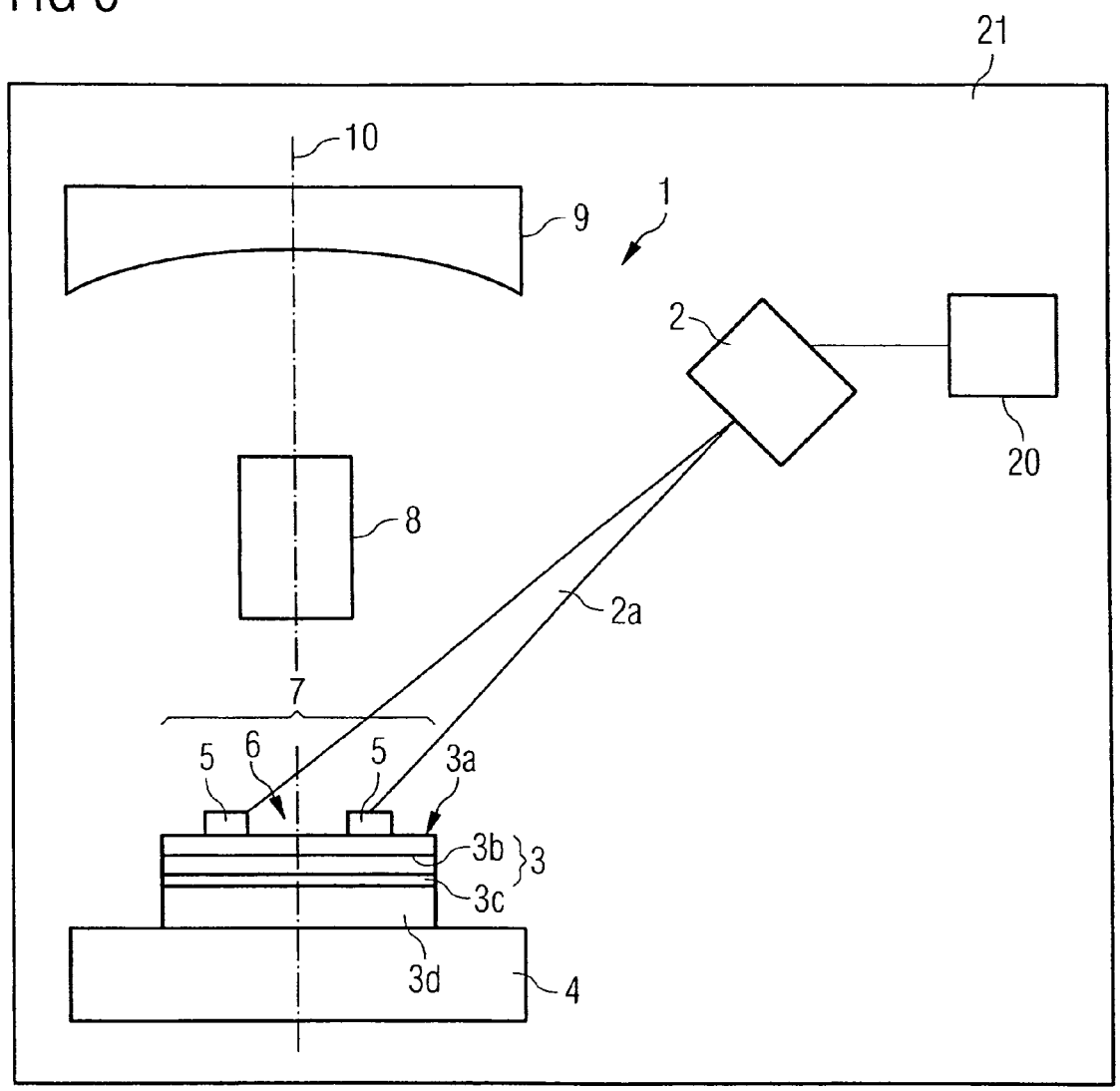
FIG. 6 shows a schematic section illustration of a projection apparatus according to one exemplary embodiment.

FIG. 6 shows a schematic section illustration of a projection apparatus according to one exemplary embodiment.

The optical projection apparatus has at least one optically pumped surface-emitting semiconductor laser 1, as has been described in conjunction with FIGS. 1 to 5. In addition to a semiconductor laser 1 as described above, the projection apparatus may also, for example, have drive electronics 20, for example for driving the pump beam source 2, and a housing 21, in which the drive electronics 20 and optically pumped surface-emitting semiconductor laser 1 are integrated. The optical projection apparatus preferably has an imaging element such as a two-dimensional scanner mirror, which guides the laser beam that has been modulated by means of the drive electronics 20 over a projection area, and in this way forms an image, for example on a projection surface.

An optical projection apparatus such as this is particularly highly suitable for use in a multimedia projector or in a back-projection television. Because of its compact size, an optical projection apparatus such as this can also be used in small appliances such as mobile telephones.

The invention is not restricted by the description based on the exemplary embodiments. In fact, the invention covers any new feature as well as any combination of features, in particular including any combination of features in the patent claims, even if this feature or this combination is not itself explicitly stated in the patent claims or in the exemplary embodiments.

We claim:

1. A semiconductor laser, comprising:
a mode-selective apparatus configured to suppress predeterminable, higher transversal resonator modes of the semiconductor laser;
wherein the mode-selective apparatus is firmly connected to a semiconductor body of the semiconductor laser, the mode-selective apparatus having a metal coating which is applied directly to an area of the semiconductor body;
wherein the metal coating has a maximum thickness of 15 nm, and a part of radiation generated by the semiconductor laser passes through said metal coating; and
wherein the semiconductor laser is an optically pumped, surface-emitting laser.

2. The semiconductor laser according to claim 1, wherein the mode-selective apparatus is arranged in a beam path of a pump beam source of the surface-emitting semiconductor laser.

3. The semiconductor laser according to claim 1, wherein the mode-selective apparatus is configured to optically influence at least a portion of pump radiation from a pump beam source of the surface-emitting semiconductor.

4. The semiconductor laser according to claim 1, wherein the mode-selective apparatus has a suppression area which is configured to optically influence laser radiation which strikes the suppression area and circulates in a resonator in the semiconductor laser such that the laser radiation is lost to the resonator power.

5. The semiconductor laser according to claim 4, wherein the suppression area is configured to absorb the laser radiation circulating in the resonator.

6. The semiconductor laser according to claim 4, wherein the suppression area is configured to change a direction of the laser radiation circulating in the resonator.

7. The semiconductor laser according to claim 1, wherein the mode-selective apparatus has an area through which laser radiation circulating in a resonator passes from a suppression area of the mode-selective apparatus without being disturbed by the mode-selective apparatus.

8. The semiconductor laser according to claim 7, wherein a size of the area is chosen such that only a transverse fundamental mode of the resonator is excitable.

9. The semiconductor laser according to claim 1, wherein the mode-selective apparatus is configured to suppress excitation of higher modes than a fundamental mode in a resonator of semiconductor laser.

10. The semiconductor laser according to claim 1, wherein the mode-selective apparatus is in direct contact with an area of the semiconductor body through which radiation can pass.

11. The semiconductor laser according to claim 1, wherein the mode-selective apparatus is formed by a zone which is structured into the semiconductor body.

12. The semiconductor laser according to claim 4, wherein the suppression area is formed by a part of the semiconductor body.

13. The semiconductor laser according to claim 4, wherein the suppression area is structured into the semiconductor body.

14. The semiconductor laser according to claim 1, wherein the mode-selective apparatus comprises an element which is applied to a surface of the semiconductor body through which radiation can pass.

15. The semiconductor laser according to claim 14, wherein the element comprises a heat sink.

16. The semiconductor laser according to claim 14, wherein the element is configured to permit frequency selection of the laser radiation passing through the element.

17. The semiconductor laser according to claim 1, wherein at least one optically non-linear crystal is arranged in a resonator of the semiconductor laser.

18. The semiconductor laser according to claim 1, further comprising:

a pump beam source which comprises a diode laser.

19. An optical projection apparatus, having a semiconductor laser according to claim 1, and having drive electronics for the semiconductor laser.

* * * * *